United States Patent
Lai

(10) Patent No.: US 9,683,886 B2
(45) Date of Patent: Jun. 20, 2017

(54) PHOTOELECTRIC CONVERTING MODULE

(71) Applicant: ScienBiziP Consulting (Shenzhen) Co.,Ltd., Shenzhen (CN)

(72) Inventor: Chih-Chen Lai, New Taipei (TW)

(73) Assignee: ScienBiziP Consulting(Shenzhen)Co.,Ltd., Shenzhen (CN)

( * ) Notice: Subject to any disclaimer, the term of this patent is extended or adjusted under 35 U.S.C. 154(b) by 247 days.

(21) Appl. No.: 14/587,147

(22) Filed: Dec. 31, 2014

(65) Prior Publication Data

US 2015/0185071 A1 Jul. 2, 2015

(30) Foreign Application Priority Data

Jan. 2, 2014 (TW) .............................. 103100081 A

(51) Int. Cl.
  G01J 1/04 (2006.01)
  G01J 1/02 (2006.01)
  H01L 23/16 (2006.01)
  H01L 31/0203 (2014.01)
  H05K 3/30 (2006.01)

(52) U.S. Cl.
  CPC ........... *G01J 1/0411* (2013.01); *G01J 1/0271* (2013.01); *H01L 23/16* (2013.01); *H01L 31/0203* (2013.01); *H05K 3/303* (2013.01); H01L 2924/0002 (2013.01); H05K 2201/10121 (2013.01); H05K 2203/167 (2013.01); Y02P 70/613 (2015.11)

(58) Field of Classification Search
  CPC .. G02B 6/4204; G02B 6/4212; G02B 6/4214; G02B 5/00; G01J 1/0403
  USPC ................. 250/216, 239; 385/31, 33, 39, 93
  See application file for complete search history.

(56) References Cited

U.S. PATENT DOCUMENTS

2014/0314424 A1* 10/2014 Sheu ...................... H04B 10/40 398/139

* cited by examiner

*Primary Examiner* — Kevin Pyo
(74) *Attorney, Agent, or Firm* — Steven Reiss

(57) ABSTRACT

A photoelectric converting module includes a circuit board, at least one light emitting/receiving unit and an optical coupler both mounted on the circuit board. Each light emitting/receiving unit includes a light emitter and a light receiver, the light emitter and the light receiver each include at least one positioning projection. The optical coupler includes positioning parts to engage with the positioning projections for aligning the optical coupler with the light emitting/receiving unit precisely.

3 Claims, 2 Drawing Sheets

PHOTOELECTRIC CONVERTING MODULE

FIELD

The present disclosure relates to communications technology, particularly to optical communications.

BACKGROUND

A photoelectric converting module usually includes a circuit board, a light emitting/receiving unit mounted on the circuit board, and an optical coupler. The optical coupler must be precisely aligned with the light emitting/receiving unit. Yet, it is not easy to precisely align the optical coupler with the light emitting/receiving unit during assembly.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Figure 1:
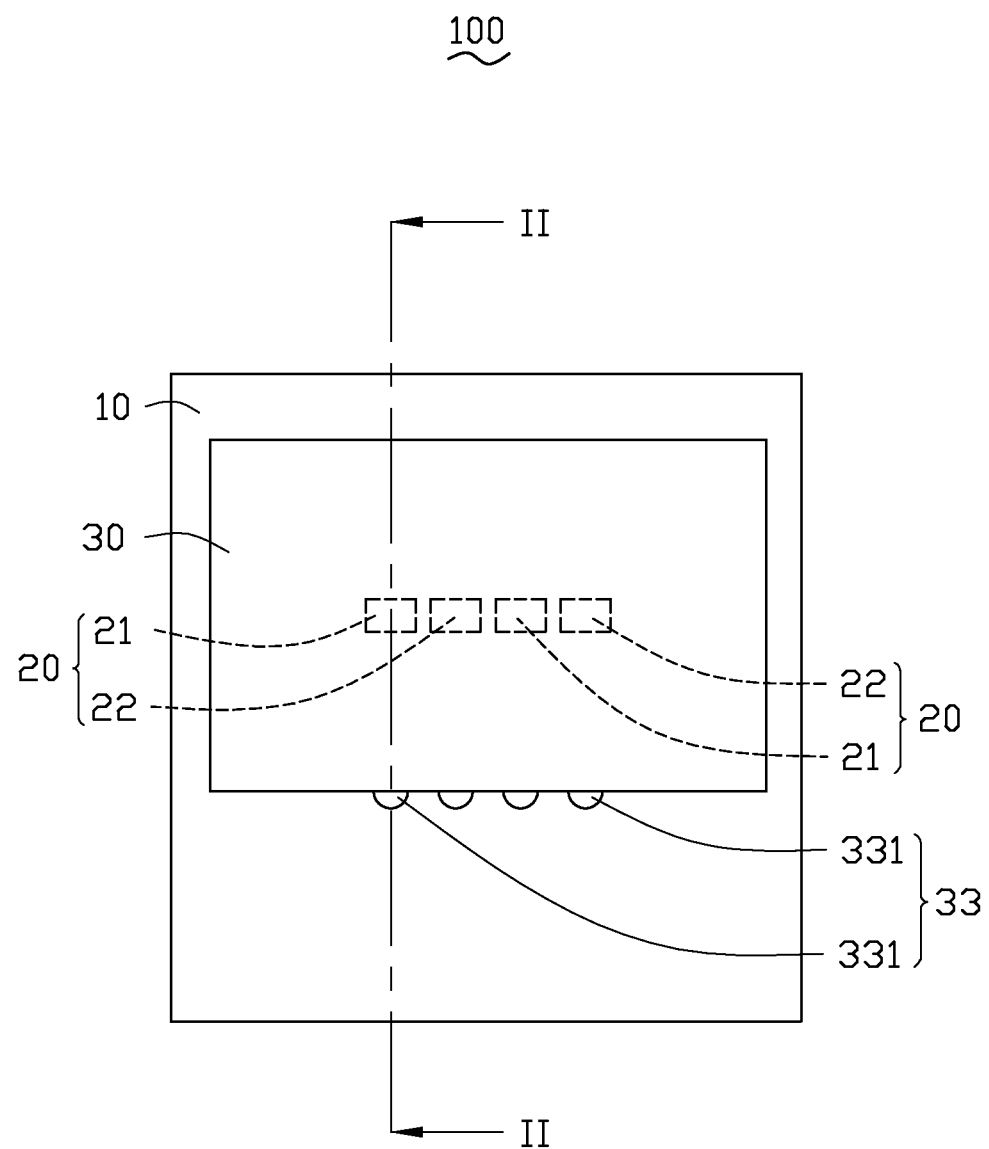
FIG. 1 is a diagrammatic, top plan view of a photoelectric converting module according to an exemplary embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like.

The present disclosure is described in relation to a light emitting device and a backlight module including the light emitting device.

Figure 2:
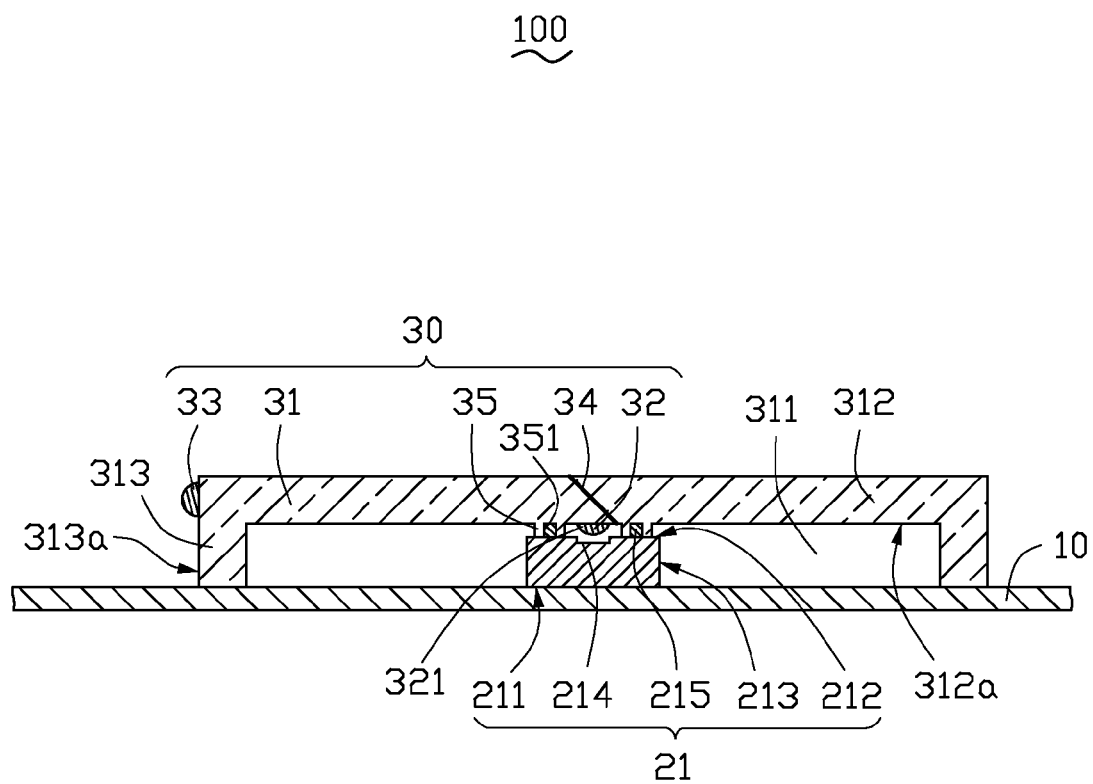
FIG. 2 is a cross-sectional view of the photoelectric converting module taken along II-II line of FIG. 1.

FIGS. 1 and 2 illustrate a photoelectric converting module 100 including a circuit board 10, at least one light emitting/receiving unit 20, and an optical coupler 30.

In this embodiment, there are two light emitting/receiving units 20. Each light emitting/receiving unit 20 includes a light emitter 21 and a light receiver 22. The light emitter 21 is a laser diode, and the light receiver 22 is a photodiode. The light emitter 21 and the light receiver 22 are located on the circuit board 10 along a straight line and are electrically connected with the circuit board 10.

The light emitter 21 includes a bottom surface 211, a top surface 212 opposite to and in parallel with the bottom surface 211, and a side surface 213 connecting the top surface 212 to the bottom surface 211. The top surface 212 defines an optical window 214 at a center thereof. The light emitter 21 further includes two positioning projections 215, adjacent to two opposite sides of the optical window 214 and located on the top surface 212. The positioning projections 215 can be made of a plastic, a metal, a glass, or other material. In this embodiment, the positioning projections 215 are made of a metal, such as copper, aluminum, nickel, or silver and are formed on the top surface 212 by means of electro-plating.

A structure of the light receiver 22 is similar to a structure of the light emitter 21 and a detailed description of the light receiver 22 is omitted.

The optical coupler 30 includes a substrate 31, at least one first converging lens unit 32, and at least one second converging lens unit 33 and a reflector 34.

The substrate 31 is substantially rectangular, and defines a receiving space 311 for receiving the light emitting/receiving unit 20. The receiving space 311 includes a top wall 312 opposite to the circuit board 10 and a side wall 313 perpendicularly connected to the top wall 312. The top wall 312 includes an inner surface 312a facing the circuit board 10. Four pairs of positioning parts 35 are formed on the inner surface 312a. Each positioning part 35 defines a groove 351 for receiving one of the positioning projections 215, to precisely align the optical coupler 30 with the light emitting/receiving unit 20. The side wall 313 includes an outer surface 313a.

Each first converging lens unit 32 includes two first converging lenses 321. Each first converging lens 321 is aligned with one of the optical windows 214 and is located between two positioning parts 35. Each second converging lens unit 33 includes two second converging lenses 331. The second converging lenses 331 are formed on the outer surface 313a and each corresponds to a first converging lens 321.

The reflector 34 is inserted into the top wall 312 for changing a transmission direction of light incident on the reflector 34. The light emitting/receiving unit 20, the optical window 214, the first converging lens 321, the reflector 34, and the second converging lens 331 cooperatively form an optical path.

As the photoelectric converting module 100 includes engaging the positioning projections 215 and positioning parts 35, the optical coupler 30 can be precisely aligned with the light emitting/receiving unit 20.

It will be understood that the above particular embodiments are shown and described by way of illustration only. The principles and the features of the present disclosure can be employed in various and numerous embodiments thereof without departing from the scope of the disclosure. The above-described embodiments illustrate the scope of the disclosure but do not restrict the scope of the disclosure.

What is claimed is:

1. A photoelectric converting module comprising:
a circuit board,
at least one light emitting/receiving unit mounted on the circuit board, each light emitting/receiving unit comprising:
a light emitter including at least one positioning projection;
the light receiver including at least one positioning projection; and
an optical coupler mounted on the circuit board, and comprising positioning parts engaged with the positioning projections for aligning the optical coupler with the light emitting/receiving unit;
wherein the light emitter comprises a top surface opposite to the circuit board, the top surface defines includes an optical window, and one of the positioning projections are formed on the top surface;
wherein the optical coupler comprises a substrate, the substrate defines a receiving space for receiving the light emitting/receiving unit, the receiving space comprises a top wall, the top wall comprises a inner surface opposite to the circuit board, the positioning parts are formed on the inner surface, and each of the positioning part defines a groove for receiving corresponding positioning projection;
wherein the optical coupler comprises a plurality of first converging lenses formed on the inner surface and corresponding to the optical windows one by one; and
wherein the receiving space comprises a side wall, having an outer surface, and the optical coupler further comprises a plurality of second converging lenses formed on the outer surface and corresponding to the first converging lenses one by one.

2. The photoelectric converting module of claim 1, wherein the optical coupler further comprises a reflector inserted in the top wall, and the first converging lenses, the reflector and the second converging lenses cooperatively form an optical path.

3. The photoelectric converting module of claim 1, wherein the positioning projections are made of a metal and are formed on the top surface by electro-plating.

* * * * *